(12) United States Patent
Sakurai (10) Patent No.: US 6,215,357 B1
(45) Date of Patent: *Apr. 10, 2001

(54) OPERATIONAL AMPLIFIER (75) Inventor: Katsuhito Sakurai, Machida (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,799

(22) Filed: Aug. 28, 1998

(30) Foreign Application Priority Data

Sep. 3, 1997 (JP) .................................. 9-238282

(51) Int. Cl.$^7$ ....................................... H03F 3/45
(52) U.S. Cl. ................................ 330/255; 330/257
(58) Field of Search .................. 330/253, 252, 330/255, 257

(56) References Cited

U.S. PATENT DOCUMENTS

| | | | | |
|---|---|---|---|---|
| 5,177,450 | * | 1/1993 | Lee et al. | 330/253 |
| 5,315,264 | * | 5/1994 | Sundby et al. | 330/253 |
| 5,371,476 | * | 12/1994 | Nishioka | 330/255 |
| 5,568,090 | | 10/1996 | Pierret | 330/255 |
| 5,668,501 | * | 9/1997 | Venes | 330/257 |
| 5,670,910 | * | 9/1997 | Kato | 330/253 |
| 5,907,259 | * | 5/1999 | Yamada et al. | 330/255 |
| 5,936,468 | * | 8/1999 | Wiese et al. | 330/257 |

FOREIGN PATENT DOCUMENTS

| | | | | |
|---|---|---|---|---|
| 000608938 | * | 8/1994 | (EP) | 330/257 |
| 1517163 | | 12/1978 | (GB). | |
| 0022853 | * | 2/1977 | (JP) | 330/257 |
| 0164310 | * | 7/1986 | (JP) | 330/257 |
| 0285810 | * | 12/1986 | (JP) | 330/257 |
| 0015911 | * | 1/1987 | (JP) | 330/257 |
| 0223807 | * | 9/1989 | (JP) | 330/257 |

OTHER PUBLICATIONS

Moraveji F: "A Tiny, High–Speed, Wide–Band, Voltage–Feedback Amplifier Stable With All Capacitive Load"; IEEE Journal of Solid–State Circuits, vol. 31, *p. 1511–p. 1516; figures 2,3.

* cited by examiner

Primary Examiner—Robert Pascal
Assistant Examiner—Khanh Van Nguyen
(74) Attorney, Agent, or Firm—Morgan & Finnegan, LLP (57) ABSTRACT

An operational amplifier provided with input and output stages comprises detecting means for detecting a differential voltage between a normal input signal terminal and an inverted input signal terminal of aforesaid input stage; and current varying means for varying a current for biasing an output stage buffer in response to an output signal produced from the detecting means. The output stage is driven by an output signal produced from the input stage by means of a single ended output; the detecting means is formed of two transistors constituting a differential amplifying configuration, respective base electrodes of which are applied with respective input signals through the normal input signal terminal and the inverted input signal terminal; each of the two transistors bears each current mirror circuit as a load; one of the current mirror circuits drives one of a complementary SEPP-type transistors on the output stage; and another of the current mirror circuits drives another of the complementary SEPP-type transistors on the output stage through still another current mirror circuit.

12 Claims, 7 Drawing Sheets

OPERATIONAL AMPLIFIER

BACKGROUND OF THE INVENTION

1. Field of the Invention

The present invention relates in general to a high-speed and low power consuming operational amplifier employed, for instance, for driving a circuit having a high input capacity such as an analogue to digital (referred to as "A/D") converter or for fast driving a circuit having a low input impedance and, in particular, to those effective to applications which require of extremely low-power consuming operations among general purpose operational amplifiers.

2. Brief Description of the Related Art

Trends toward the low power dissipation, the high operational speed and the miniaturization of the components have been accelerated in response to the recent demands on thinning and down-sizing of equipment and to the technological progression. In the operational amplifiers which act as a sort of arithmetic circuits, the low power consumption and the extremely high operational speed have been achieved by means of a low supply voltage, an unbalanced power supply and a high density integration.

Figure 6:
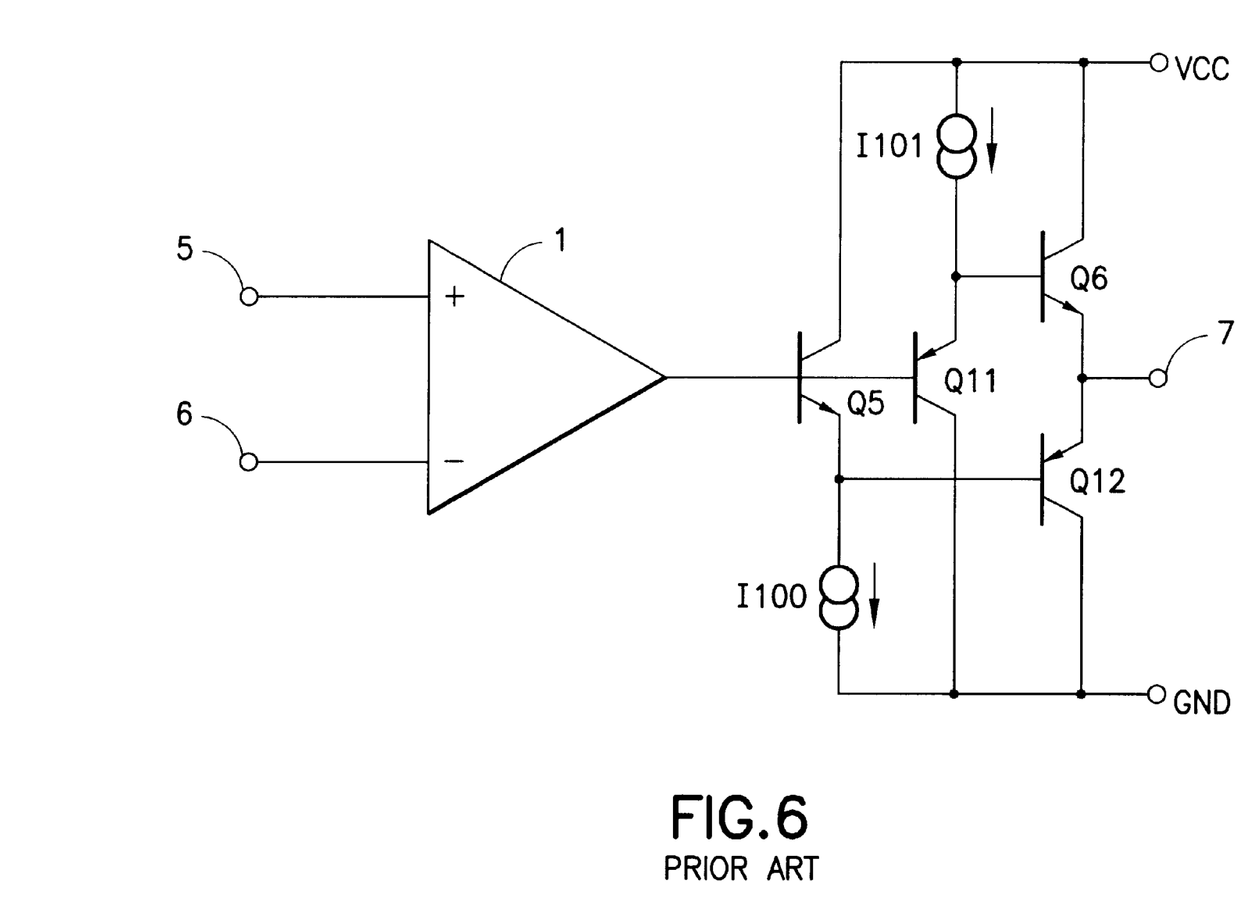
FIG. 6 (PRIOR ART) is a block diagram showing constituents of a conventional operational amplifier.
Figure 7:
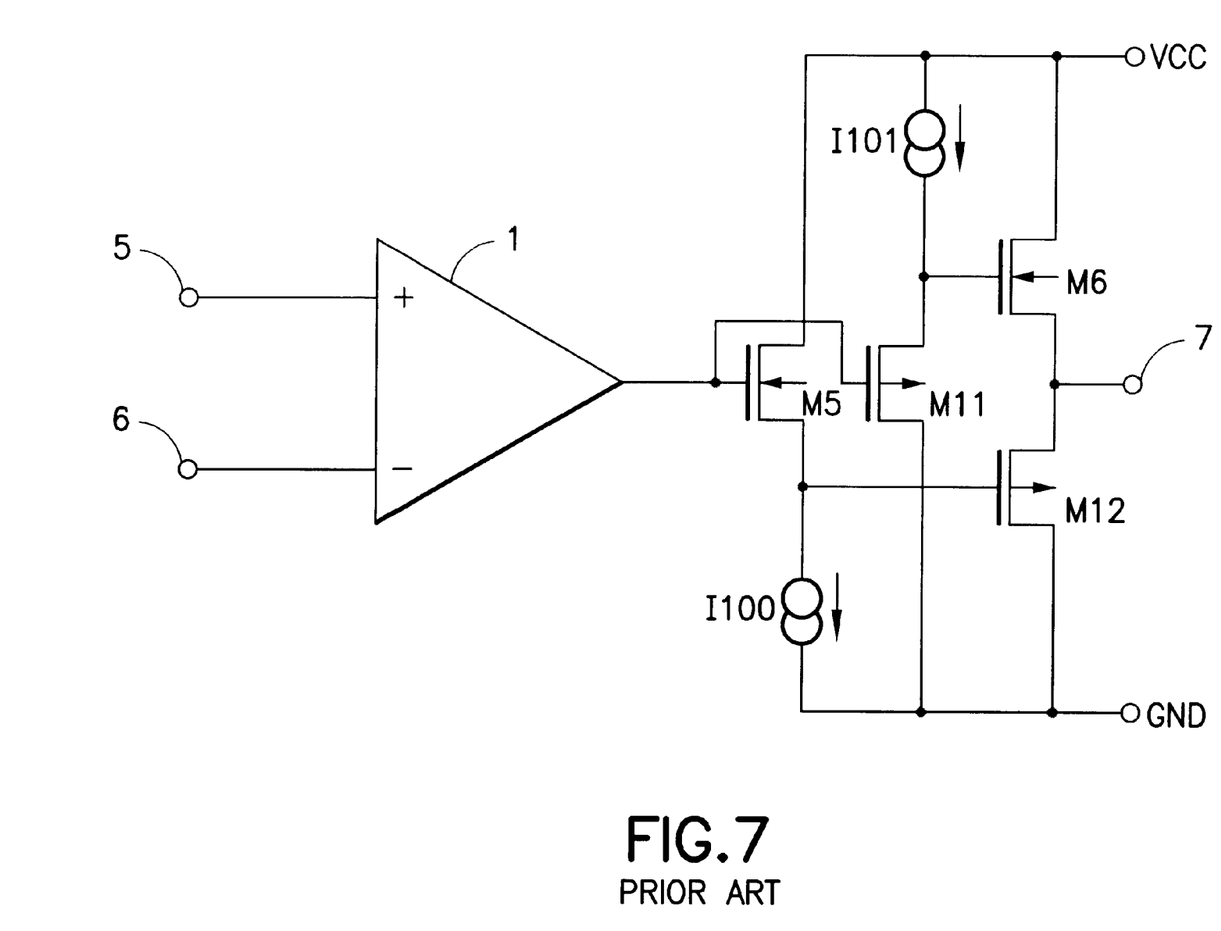
FIG. 7 (PRIOR ART) is another block diagram showing constituents of another conventional operational amplifier.

Constitutions shown in FIGS. 6 and 7 have been known up to now as conventional output stages of the operational amplifiers. FIGS. 6 and 7 are block diagrams for showing constitutions of the output stages of the operational amplifiers particularly in detail. FIG. 6 illustrates a circuit which is constituted of bipolar transistors while FIG. 7 illustrates the circuit which is constituted of metal-oxide-semiconductor (referred to as "MOS") transistors. In FIGS. 6 and 7, a numeric character 1 stands for an operational amplifying circuit except for a high drivability output stage, 5 stands for a normal input signal terminal and 6 stands for an inverted input signal terminal. Output signals produced from the operational amplifier 1 are applied to of the output stage wherein the signals are transformed in impedance to be applied to an output signal terminal 7. In either case, an emitter follower configuration or a source follower connection is biased with a constant current circuit 100 or 101 so that an idling current is kept constant. Such constitution of the output stage as mentioned above requires to allot large transistors in size to final stage transistors Q6, Q12, M6 and M12 in order to drive heavy loads which is connected to the output terminal 7.

However, because aforesaid conventional examples require to drive either a base or a gate electrode of the large transistor in chip size with a constant current, it is necessary to enlarge the constant current value for accelerating the driving speed. Accordingly, there has been a problem that an increase in dissipated current obstructs a reduction in power consumption.

SUMMARY OF THE INVENTION

The present invention is carried out to solve the problem mentioned above. An object of the present invention is to provide a low power consuming operational amplifier which can drive a heavy load at high speed.

A first technology according to the present invention comprises:

detecting means for detecting a differential voltage between a normal input signal terminal and an inverted input signal terminal; and current varying means for varying a current for biasing an output stage buffer in response to an output signal produced from the aforesaid detecting means.

A second technology according to the present invention is the first technology, wherein:

aforesaid detecting means for detecting the differential voltage is constituted of a differential amplifier.

A third technology according to the present invention is the second technology, wherein:

means for reducing a conductance gm is provided in the differential amplifier which is used as the detecting means for detecting the differential voltage.

A fourth technology according to the present invention is the first technology, wherein:

a bipolar transistor is included as a constituent.

A fifth technology according to the present invention is the first technology, wherein:

an MOS transistor is included as a constituent.

Further, a sixth technology according to the present invention provides an operational amplifier including:

an input stage having differential amplifying means; and an output stage producing an certain driving power by means of constant current supply means; comprising:

detecting means for detecting a differential voltage between a normal input signal terminal and an inverted input signal terminal of aforesaid input stage; and electric current varying means for varying a constant current supplied from aforesaid constant current supply means in response to an output signal produced from the detecting means.

A seventh technology according to the present invention is the sixth technology, wherein:

an output signal produced from aforesaid differential amplifying means drives aforesaid output stage as a single ended output signal;

aforesaid detecting means is formed of two transistors constituting a differential circuit of which base electrodes are applied with the respective input signals through the normal input signal terminal and the inverted input signal terminal;

each of aforesaid two transistors bears each current mirror circuit as a load;

one of aforesaid current mirror circuits drives one transistor of aforesaid output stage which is constituted as a complementary single ended push-gull (referred to as "SEPP") circuit; and another of aforesaid current mirror circuits drives another transistor of aforesaid output stage constituted as the complementary SEPP-type circuit through a still another current mirror circuit.

An eighth technology according to the present invention is the seventh technology, wherein:

emitter electrodes of aforesaid two transistors constituting the differential amplifying configuration are connected to each other by short-circuiting; and aforesaid emitter electrodes are further connected through a constant current circuit to a reference potential point.

A ninth technology according to the present invention is the seventh technology, wherein:

each emitter electrode of aforesaid two transistors constituting the differential amplifying configuration is connected through each resistor to a constant current source which is further connected to a reference potential point.

A tenth technology according to the present invention is the seventh technology, wherein:

each emitter electrode of aforesaid two transistors constituting the differential amplifying configuration is connected through each constant current circuit to a reference potential point; and aforesaid emitter electrodes are further connected to each other through a resistor.

An eleventh technology according to the present invention is the sixth technology, wherein:

an output signal produced from aforesaid differential amplifying means drives aforesaid output stage as a single ended output signal;

aforesaid detecting means is formed of two transistors constituting a differential circuit of which gate electrodes are applied with the respective input signals through the normal input signal terminal and the inverted input signal terminal;

each of aforesaid two transistors bears each current mirror circuit as a load;

one of aforesaid current mirror circuits drives one transistor of aforesaid output stage which is constituted as a complementary SEPP circuit; and another of aforesaid current mirror circuits drives another transistor of aforesaid output stage constituted as the complementary SEPP-type circuit through a still another current mirror circuit.

A twelfth technology according to the present invention is the eleventh technology, wherein:

source electrodes of aforesaid two transistors constituting the differential amplifying configuration are connected to each other by short-circuiting; and further connected through a constant current circuit to a reference potential point.

A thirteenth technology according to the present invention is the eleventh technology, wherein:

each source electrode of aforesaid two transistors constituting the differential amplifying configuration is connected through each resistor to a constant current source which is further connected to a reference potential point.

A fourteenth technology according to the present invention is the eleventh technology, wherein:

each source electrode of aforesaid two transistors constituting the differential amplifying configuration is connected through each constant current circuit to a reference potential point; and aforesaid source electrodes are further connected to each other through a resistor.

DETAILED DESCRIPTION OF THE PREFERRED EMBODIMENTS

Hereinafter described are the preferred embodiments according to the present invention with reference to the drawings from FIGS. 1 to 5. The best mode contemplated during carrying out the present invention into practice will be also described corresponding to the preferred embodiments.

Embodiment 1

Figure 1:
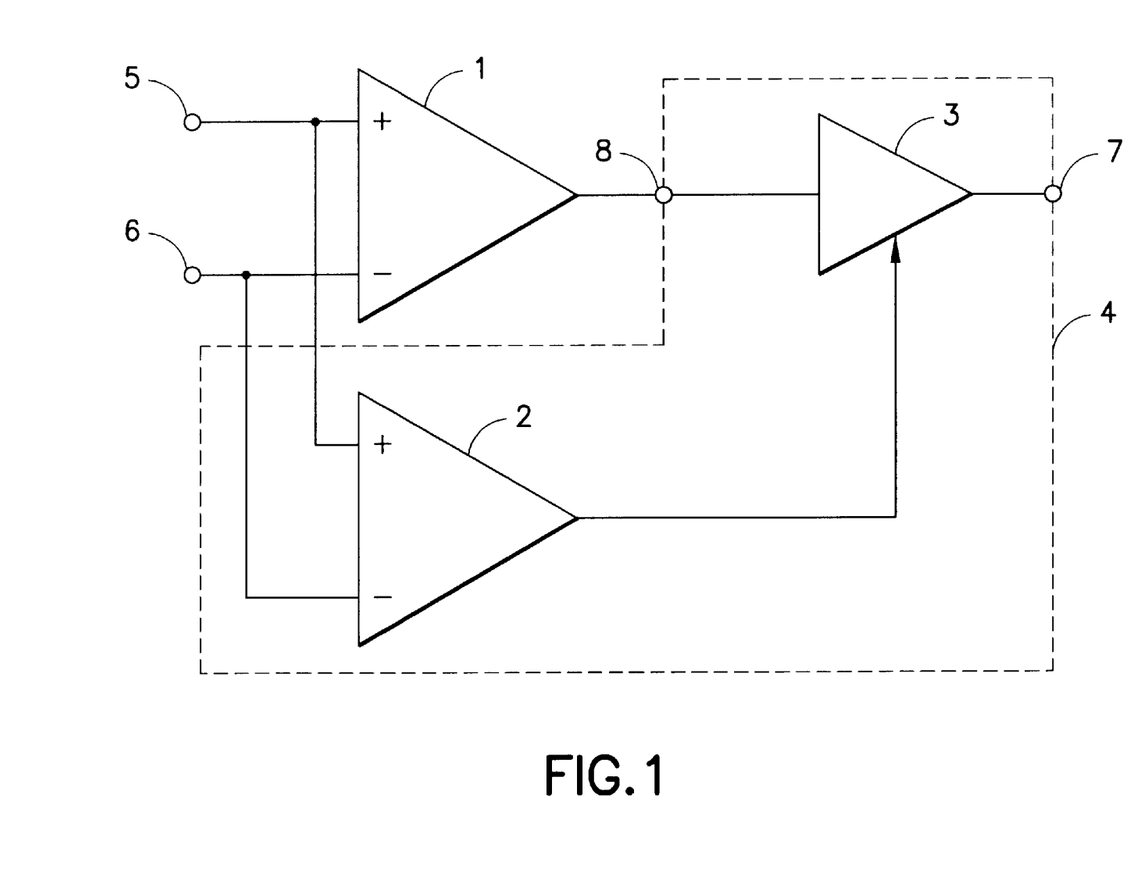
FIG. 1 is a block diagram showing constituents of an operational amplifier in Embodiment 1 according to the present invention.

FIG. 1 is a block diagram showing constituents of an operational amplifier in Embodiment 1 according to the present invention.

In FIG. 1, a numerical character 1 stands for an operational amplifier except for its output stage, 5 stands for a normal (uninverted) input signal terminal and 6 stands for an inverted input signal terminal. An output signal produced from the operational amplifier 1 is applied to an output stage buffer 3 including bias current varying means, wherein it is transformed in impedance to be applied further to an output signal terminal 7. A numerical sign 2 stands for differential voltage detecting means for detecting a difference in voltage between the normal input signal terminal and the inverted input signal terminal 6. The detected difference in voltage is applied to the output stage buffer 3 to be employed as a control signal for varying a bias current of the output stage buffer.

In the constitution mentioned above, when a voltage of an input signal applied to the normal input signal terminal 5 is higher than that of an inverted input signal applied to the inverted input signal terminal 6, the bias current of the output stage buffer 3 is varied so as to enhance a driving ability of a semiconductor device which raises the output voltage of the output signal terminal 7. On the contrary when the voltage of the normal input signal is lower than that of the inverted input signal, the bias current of the output stage buffer 3 is varied so as to enhance a sinking ability of another device which lowers the output voltage of the output signal terminal 7.

Figure 2:
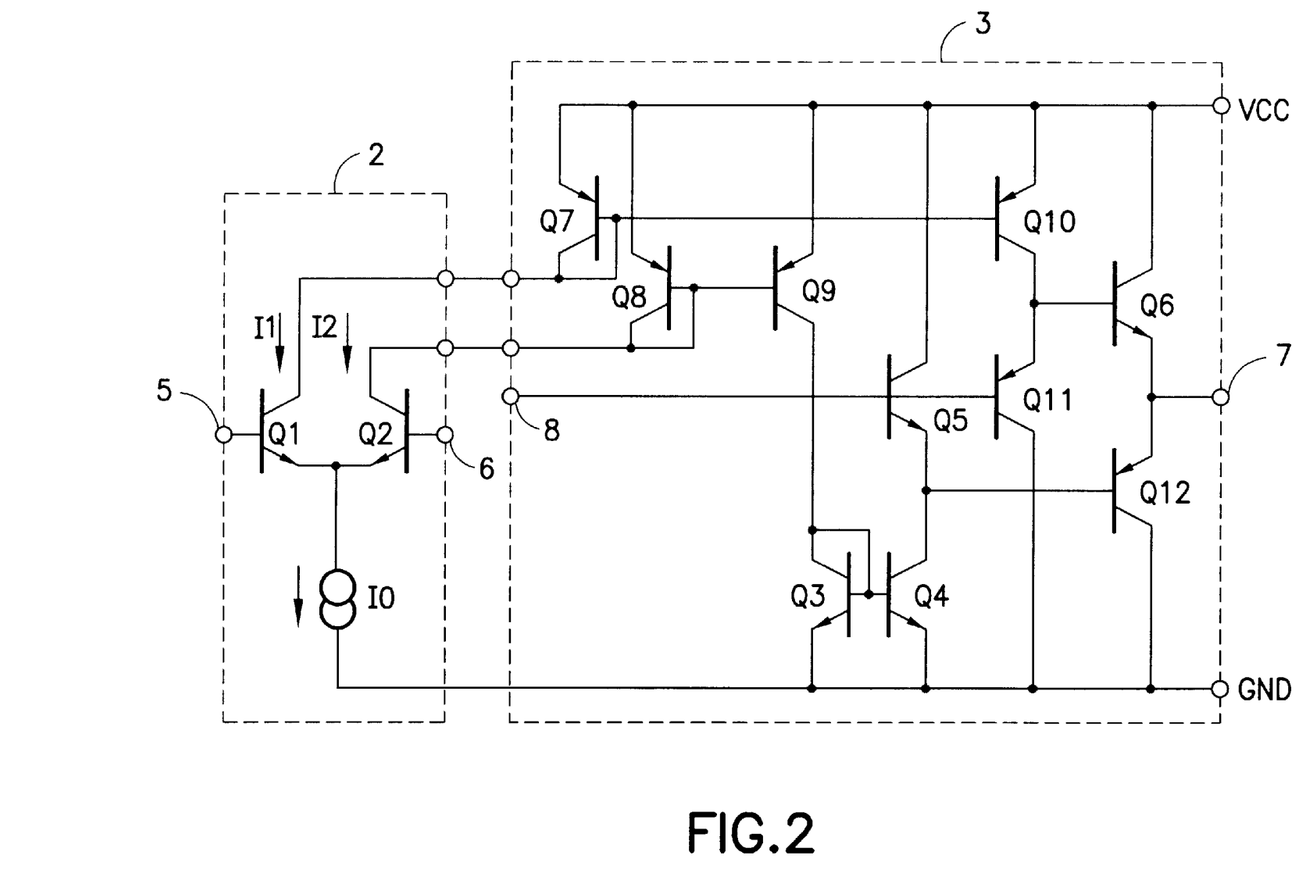
FIG. 2 is a circuit diagram for illustrating constitutions of major parts in differential voltage detecting means 2 and in an output stage buffer 3 including bias current varying means shown in FIG. 1 which are mainly formed of bipolar devices.
Figure 3:
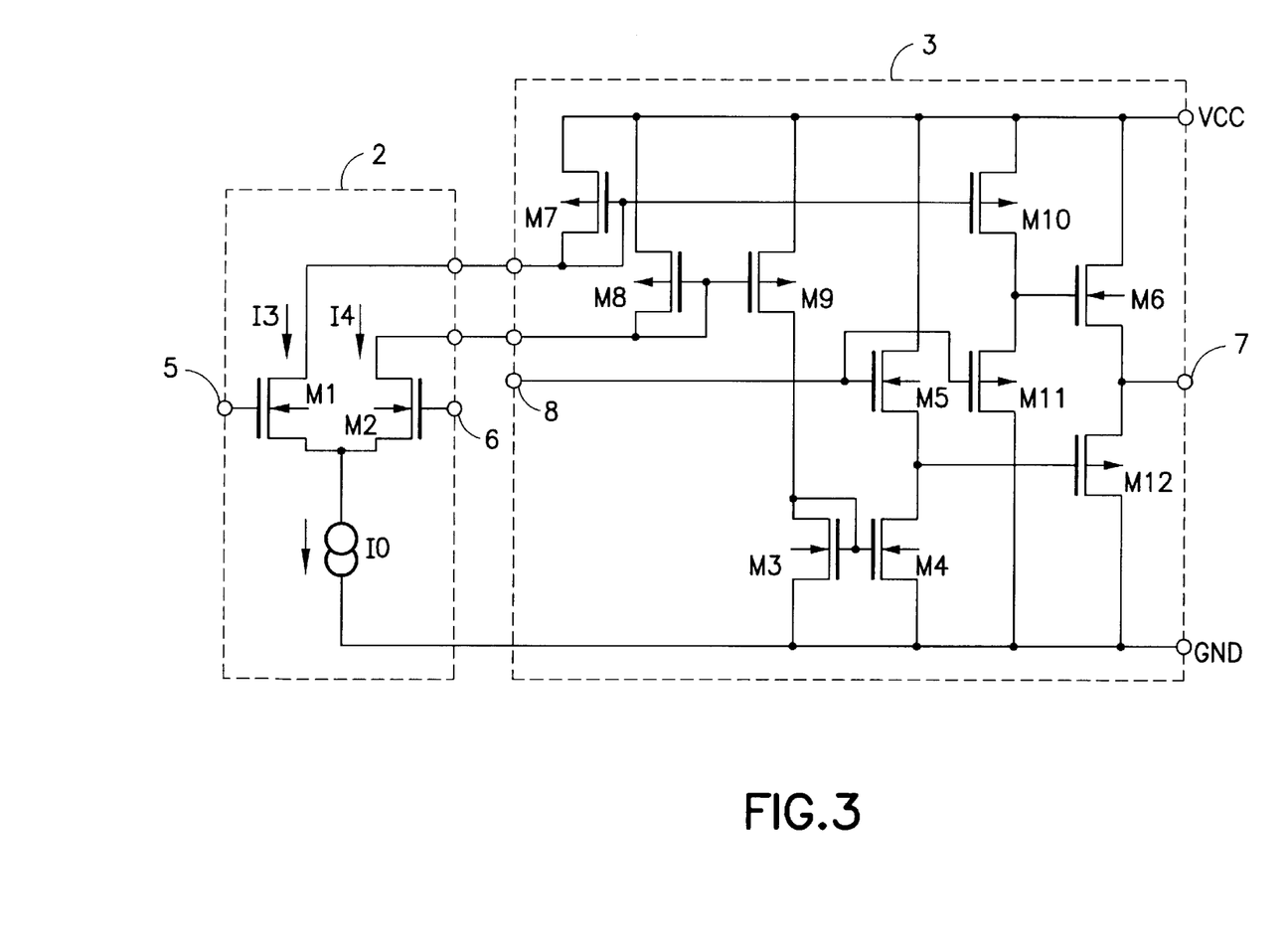
FIG. 3 is another circuit diagram for illustrating the constitutions of the major parts in the differential voltage detecting means 2 and in the output stage buffer 3 including the bias current varying means shown in FIG. 1 which are mainly formed of unipolar devices.

FIGS. 2 and 3 are circuit diagrams for illustrating the main constitutions of the differential voltage detecting means 2 and the output stage buffer 3 including the bias current varying means, both of which are shown in an enclosed portion 4 with a dotted line of FIG. 1. Herein the same constituents as those of FIG. 1 are attached with the same numerical numbers as in FIG. 1. FIG. 2 shows a circuit which is formed of bipolar transistors while FIG. 3 shows that which is formed of MOS transistors.

In FIG. 2, a numeric character 10 stands for a constant current source of differential amplifying transistors Q1 and Q2, from Q1 to Q6 are npn-type transistors and from Q7 to Q12 are pnp-type transistors. The differential voltage detecting means is constituted of a differential amplifier wherein a base electrode of the transistor Q1 is connected to the normal input signal terminal 5, another base electrode of the transistor Q2 is connected to the inverted input signal terminal 6 and respective output signals are produced from respective collector currents of the transistors Q1 and Q2. If a current flowing through the constant current source 10 is denoted by I0, the collector current of transistor Q1 is I1 and the collector current of the transistor Q2 is I2, the differential voltage V between the normal input signal voltage Vp and the inverted input signal voltage Vn is denoted by following equations:

$$I1 = I0/\{1+\exp[-q(Vp-Vn)/kT]\} \quad (1)$$

$$I2 = I0/\{1+\exp[q(Vp-Vn)/kT]\} \quad (2)$$

Herein q is an electronic charge, k is Boltzmann's constant and T is absolute temperature.

The output currents I1 and I2 are applied respectively to current mirror circuits constituted respectively of the pnp-type transistors Q7 and Q10 as well as of Q8 and Q9 which are connected respectively to input terminals of the bias current varying means. An output current produced from the transistor Q10 serves directly as a bias current of the transistor Q11 constituting an emitter follower configuration. Another output current produced from the transistor Q9 is applied to a third current mirror circuit constituted of the npn-type transistors Q3 and Q4 further to serve as another bias current of the transistor Q5 constituting another emitter follower configuration. Output signals produced from the transistors Q11 and Q5 operating respectively in the emitter follower configurations are finally applied respectively to base electrodes of transistors Q6 and Q12 located on a final stage of the amplifier. Herein transistors Q6 and Q12 are complementary SEPP-type power transistors constituting the emitter follower configurations, for which large transistors in die size are employed in general.

On the other hand, an output signal produced from the operational amplifier 1 is applied to an input signal terminal 8 of the output stage buffer to be directly transferred to base electrodes of the transistors Q5 and Q11.

When Vp is higher than Vn of the input signals herein, the input signal terminal 8 of the output stage buffer rises in potential. Then, the output powers produced from the transistors Q5 and Q11 of the emitter follower configurations increase to raise base potentials of the transistors Q6 and Q12, which in turn raises potential of the output signal terminal 7. If a potential change in the input signals takes place abruptly, however, the base potentials of the transistors Q6 and Q12 cannot follow because of parasitic capacities accompanying with base layers of the power transistors. During that, an enough potential is applied across an emitter-base junction of the transistor Q5, which produces an enough emitter current to drive the base electrode of the transistor Q12 to enable raising the base potential quickly. However, the base potential of the transistor Q6 only rises at a charging-up speed of the capacity parasitic to the base layer which is performed by the constant current flowing through the transistor Q10 because the transistor Q11 is turned off. To accelerate this charging speed requires in general to enhance always the current flowing constantly through the transistor Q10, which in turn increases extremely a dissipation current. This current is transiently necessary only when the input signals vary while the current is unnecessary when the input signals stay at a stationary status.

Accordingly, the present embodiment is constituted so that the current I1 shall exceed the current I2 only when Vp is transiently higher than Vn in input signals in order to increase the constant current fed to the transistor Q10 that constitutes the current mirror circuit together with transistor Q7, which increases the bias current of the transistor Q11. The bias current further drives the base electrode of the transistor Q6. Accordingly, the constitution according to the present embodiment enables the high-speed driving without increasing the dissipation current, compared with always enhancing the current flowing constantly which is employed for biasing.

Next, the potential of the input signal terminal 8 of the output stage buffer lowers when Vp is less than Vn in the input signals. Then, the output powers produced from the transistors Q5 and Q11 that constitute respectively the emitter follower configurations are reduced to lower the base potentials of the transistors Q6 and Q12, which lowers further the potential of the output signal terminal 7. If the potentials of the input signals vary abruptly, however, the base potentials of those transistors cannot follow because of the parasitic capacities accompanying with the base layers of the transistors Q6 and Q12. During that, the enough forward bias is applied across the base-emitter junction of the transistor Q11, which can sink carriers located in the base layer of the transistor Q6 to lower rapidly the base potential while the base potential of the transistor Q12 can only be lowered at the speed that the constant current flowing through the transistor Q4 discharges because the transistor Q5 is turned off. In order to accelerate this lowering speed, it is required in general to always enhance the constant current flowing through the transistor Q4, which increases in turn the dissipation current extremely. This current is transiently necessary only when the input signals vary while it is unnecessary when the input signals stay at the stationary status.

Accordingly, it is constituted in the present embodiment that I2 shall be higher than I1 only when Vp is lower than Vn in potential of the input signal to increase the constant current fed to the transistor Q9 constituting the current mirror configuration together with transistor Q8, which increases the constant current flowing through the transistors Q3 and Q4 constituting another current mirror circuit to increase the bias current applied to the transistor Q5. Further, this bias current sinks the electric carriers located in the base layer of the transistor Q12. As a result, this enables a high-speed sinking without increasing the dissipation current, compared with enhancing always the constant current flowing for serving as the bias current.

Although it is described in FIG. 2 that the differential amplifier serving as the differential voltage detecting means is constituted of the npn-type transistors, it is no need to say that a similar constitution is capable even by the use of the pnp-type transistors.

Next in FIG. 3, alphabetic and numeric signs from M1 to M6 stand for nMOS transistors while from M7 to M12 stand for pMOS transistors. The differential voltage detecting means 2 is constituted of a differential amplifier of which output signals are respective drain currents of the transistors M1 and M2 while the normal input signal terminal is a gate electrode of the transistor M1 and the inverted input signal terminal is a gate electrode of the transistor M2. When a current fed from a constant current source connected to the nMOS transistors M1 and M2 is denoted by I0, the drain current of M1 is denoted by I3 and the drain current of M2 is denoted by I4, the output currents are designated by the following equations as a function of the differential voltage Vp−Vn between the normal input potential Vp and the inverted input potential Vn:

$$I3=\{I0+[I0^2-(I0-K(Vp-Vn)^2)^2]^{1/2}\}*\frac{1}{2} \quad (3)$$

$$I4=\{I0-[I0^2-(I0-K(Vp-Vn)^2)^2]^{1/2}\}*\frac{1}{2} \quad (4)$$

Herein K is represented by $(u*Cox/2)*(W/L)$, wherein u is a carrier mobility in a channel of the MOS transistor, Cox is a capacity of a gate oxide film, W is a channel width and L is a channel length.

Those output currents I3 and I4 are applied to respective current mirror circuits respectively constituted of the transistors M7 and M10 together with M8 and M9. The transistors M7 and M8 are connected respectively to input signal terminals of the bias varying means. An output current produced from the transistor M10 serves directly as a bias current of the transistor M11 constituting a source follower configuration. Another output current produced from the transistor M9 is applied through another current mirror circuit, which is constituted of the transistors M3 and M4, as a bias current of the transistor M5 constituting a source follower configuration. Further, output signals produced from the respective source follower configurations are applied respectively to the gate electrodes of the transistors M6 and M12 on the final stage. The transistors M6 and M12 are complementary SEPP-type power transistors which employ in general large transistors in chip size to be provided with large driving capabilities.

On the other hand, the output signal produced from the operational amplifier 1 is applied through the input signal terminal 8 of an output stage buffer to gate electrodes of the transistors M5 and M11.

When Vp is higher than Vn in input potentials herein, the potential of the input signal terminal 8 of the output stage buffer rises. Then, the output currents produced from the transistors M5 and M11 constituting the source follower configurations increase to raise the gate potentials of the transistors M6 and M12, which in turn raises the potential of the output signal terminal 7. If the input potentials vary rapidly, the gate potentials of the power transistors cannot follow the changes because of the parasitic capacities accompanying with gate electrodes of the transistors M6 and M12. During that, an enough potential is applied between the gate and the source electrodes of the transistor M5 which can drive the gate electrode of the transistor M12 to raise rapidly its gate potential while the gate potential of the transistor M6 can rise only at a rate that the constant current flowing through the transistor M10 charges the gate capacity of M6. In order to accelerate the rising speed of the gate potential of the transistor M6, it is required in general to increase always the constant current fed to the transistor M10, which in turn increases extremely the dissipation current. This current is transiently necessary only when the input signals vary while it is unnecessary the input signals stay at the stationary status.

Accordingly, it is constituted in the present embodiment so that I3 shall be higher than I4 only when the Vp is higher than Vn at a transient status of the input potentials to increase the constant current flowing through the transistors M10 constituting the current mirror circuit together with the transistor M7, which increases in turn the bias current of the transistor M11. This bias current drives the gate electrode of the transistor M6. Consequently, the high-speed driving turns capable without increasing the dissipation current, compared with increasing the constant current always flowing for biasing.

Subsequently, the potential of the input signal terminal 8 of the output stage buffer lowers when Vp is less than Vn in input potentials. Then, the output currents produced from the transistors M5 and M11 constituting the source follower configurations are reduced, which lowers the gate potential of the transistors M6 and M12 to lower the potential of the output signal terminal 7 finally. When the input potentials vary rapidly, however, the gate potentials of the power transistors M6 and M12 cannot follow the change in input potentials because of the parasitic capacities accompanying with the gate electrodes of those transistors. During that, an enough potential is applied between the gate and the source electrodes of the transistor M11 to sink the charges from the gate electrode of the transistor M6, which can lower rapidly the gate potential, while the gate potential of the transistor M12 can barely be reduced at a rate that the constant current flowing through the transistor M4 discharges the gate capacity because the transistor M5 is turned off. In order to accelerate this lowering speed of the gate potential, it is required in general to always increase the constant current fed to the transistor M4, which in turn increases the dissipation current extremely. This current is transiently necessary only when the input signals vary and it is unnecessary when the input signals are at a stationary status.

Accordingly, the circuit is constituted in the present status so that I3 shall be less than I4 only when Vp is less than Vn at a transient status of the input potentials, which increases the constant current fed to the transistor M9 constituting a current mirror circuit together with the transistor M8 to increase the constant current fed to the transistors M3 and M4 constituting another current mirror circuit, which in turn increases the bias current of the transistor M5. Further, this bias current sinks the electric charges located on the gate electrode of the transistor M12. Consequently, it turns capable to provide a high-speed sinking the charges without increasing the dissipation current, compared with increasing always the constant current used for biasing.

Although it is indicated in FIG. 3 that a procedure of constituting the differential amplifier for use in differential voltage detecting means 2 is shown by employing the nMOS transistors, it is no need to say that a similar constitution is capable by employing the pMOS transistors.

Embodiment 2

Figure 4:
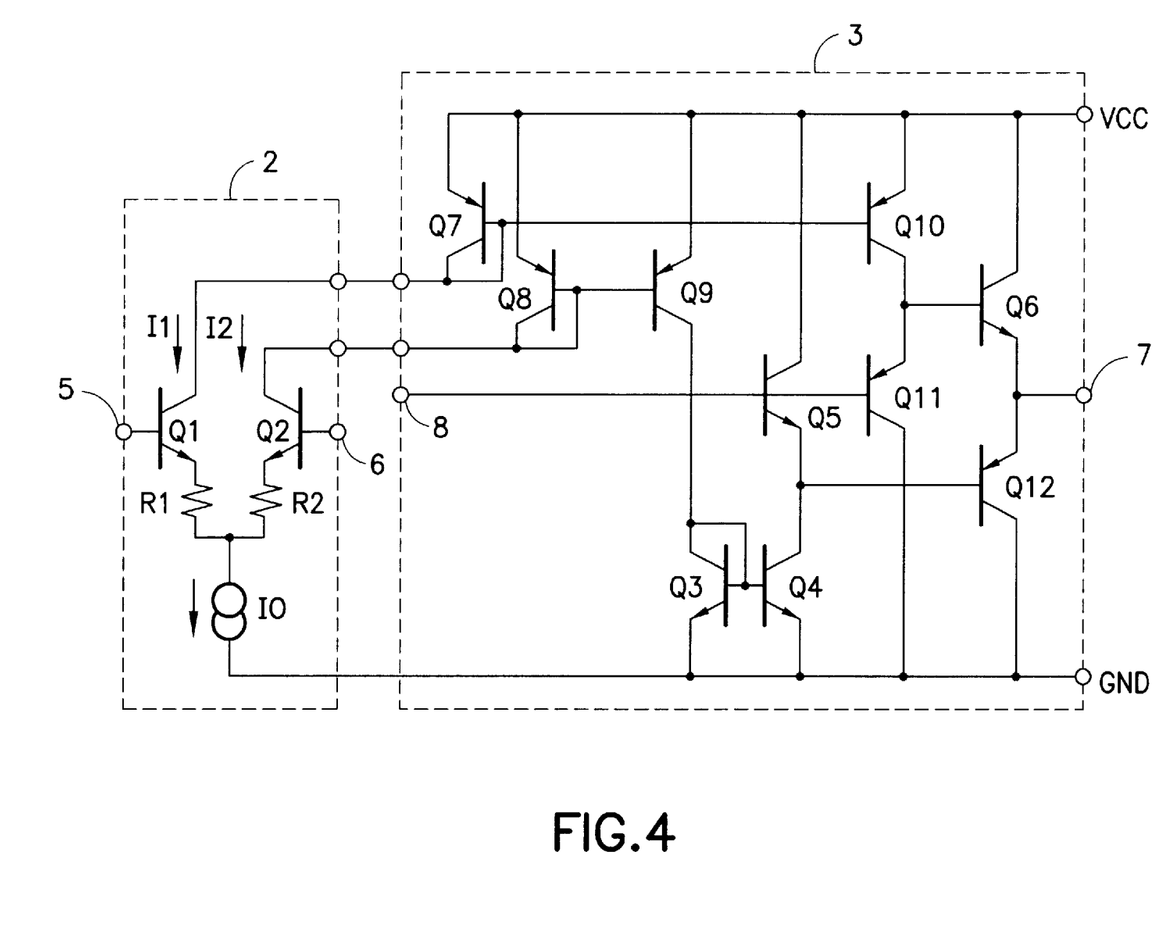
FIG. 4 is a view showing constituents of an operational amplifier in Embodiment 2 according to the present invention and also still another circuit diagram for illustrating the constitutions of the major parts in the differential voltage detecting means 2 and in the output stage buffer 3 including the bias current varying means shown in FIG. 1.

FIG. 4 is a view showing Embodiment 2 according to the present invention and also a circuit diagram for illustrating main constitutions of differential voltage detecting means 2 and an output stage buffer 3 including bias varying means, both of which are shown in a portion 4 enclosed with a dotted line of FIG. 1. Herein the same constituents as those in FIGS. 1 and 2 are denoted by the same numeric and alphabetic signs as in FIGS. 1 and 2 to omit any duplication in description.

In FIG. 2, conductances gm of the differential voltage detecting means 2 are defined as follows:

$$gm1=dI1/d(Vp-Vn) \quad (5)$$

$$gm2=dI2/d(Vp-Vn) \quad (6)$$

Herein the conductances gm1 and gm2 are designated by the following equations:

$$gm1=1/(re1+re2) \quad (7)$$

$$gm2=-1/(re1+re2) \quad (8)$$

wherein re1 and re2 are respectively equivalent resistances of the emitter layers of the transistors Q1 and Q2 for use in differential amplification and defined respectively as follows:

$$re1=kT/qI1 \quad (9)$$

$$re2=kT/qI2 \quad (10)$$

FIG. 4 differs from FIG. 2 at the point that resistors R1 and R2 are respectively connected in series to respective emitter electrodes of the transistors Q1 and Q2. In FIG. 4, the conductances gm of the differential voltage detecting means are obtained by the following equations:

$$gm1=1/(re1+re2+R1+R2) \quad (11)$$

$$gm2=-1/(re1+re2+R1+R2) \quad (12)$$

Accordingly, the conductances gm decrease herein compared with the case in FIG. 2, which broadens an allowable range in input differential voltage applied to the differential voltage detecting means 2 with respect to a saturation level in emitter current of the transistor. Furthermore, it makes variations in bias current of the output stage moderate relative to variations in input differential voltage, which can suppress overshoots and undershoots in output signal with respect to abrupt changes in input signal.

Embodiment 3

Figure 5:
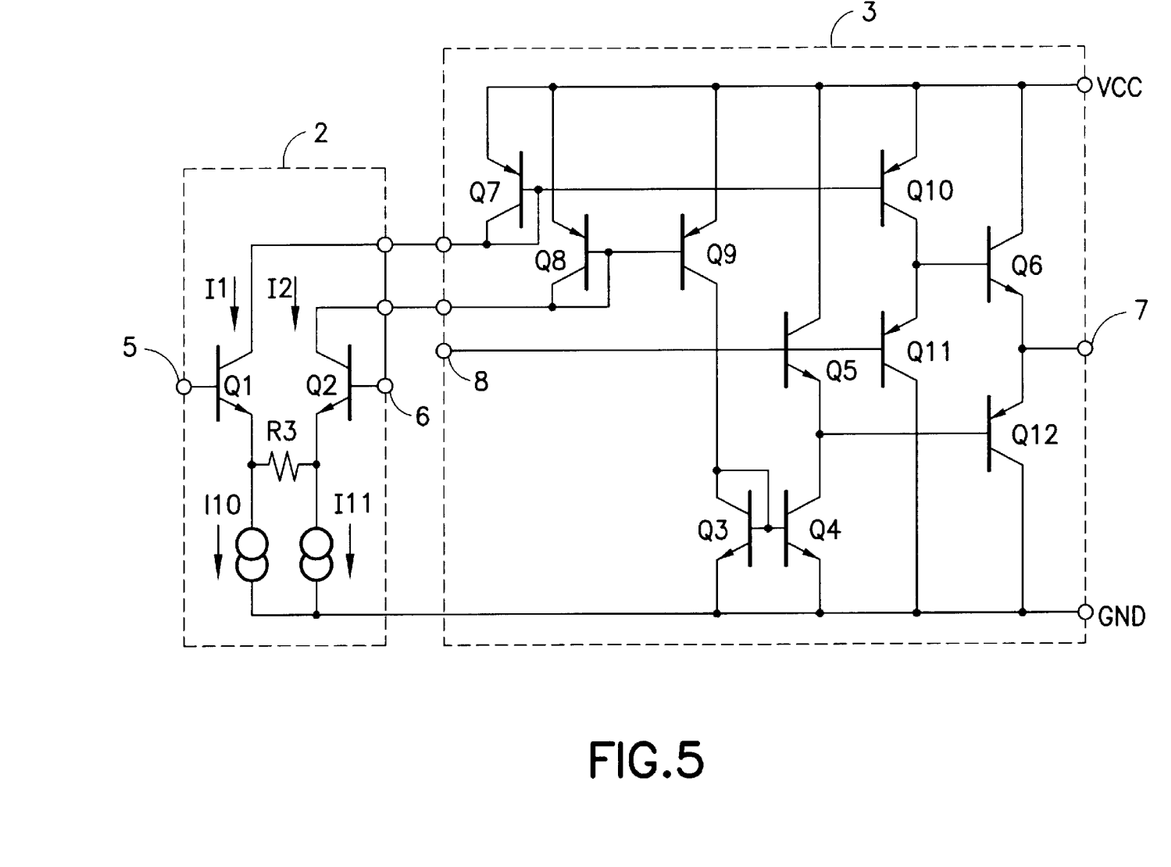
FIG. 5 is another view showing constituents of an operational amplifier in Embodiment 3 according to the present invention and simultaneously further still another circuit diagram for illustrating the constitutions of the major parts in the differential voltage detecting means 2 and in the output stage buffer 3 including the bias current varying means shown in FIG. 1.

FIG. 5 is a view showing Embodiment 3 according to the present invention and simultaneously a circuit diagram for illustrating main constitutions of differential voltage detecting means 2 and an output stage buffer 3 including bias varying means, both of which are shown in a portion 4 enclosed with a dotted line of FIG. 1. The present embodiment enables the equivalent operations to those of Embodiment 2. The same constituents as those of FIG. 2 are attached with the same numeric and alphabetic characters to omit the duplication in description. In FIG. 5, a resistor R3 is connected between emitter electrodes of differential transistors Q1 and Q2 for use in differential voltage detecting means 2 while respective constant current circuits I10 and I11 are connected to the respective emitter electrodes.

Conductances gm of the differential voltage detecting means in FIG. 5 are represented by the following equations:

$$gm1=1/(re1+re2+R3*½) \quad (11)$$

$$gm2=-1/(re1+re2+R3*½) \quad (12)$$

Accordingly, the conductances gm decrease similarly to Embodiment 2 compared with the case of FIG. 2, which enlarges the allowable range in input differential voltage applied to the differential voltage detecting means 2. Furthermore, it renders the variations in bias current of the output stage moderate relative to the variations in input differential voltage, which can suppress the overshoot and the undershoot in output signals with respect to the abrupt changes in input signal.

As mentioned above, the first technology according to the present invention increases the bias current of the output stage buffer toward the desired direction in response to the differential voltage between the normal input signal terminal and the inverted input signal terminal, which enables a faster operation and a suppression of the dissipation current compared with the constant current biasing.

The second technology according to the present invention employs the differential amplifier which serves as the detecting means for detecting the differential voltage between the normal input signal terminal and the inverted input signal terminal, which can carry the first technology into practice through a very simple constitution to enable a low power consumption and a high density integration.

The third technology according to the present invention reduces the conductances gm of the differential amplifier for detecting the differential voltage, which can vary the bias current of the output stage in the wide range of the differential voltage between the normal input signal terminal and the inverted input signal terminal. Furthermore, it makes the variation in bias current of the output stage moderate with respect to the variation in input differential voltage, which enables suppressing the overshoots and the undershoots in output signal relative to the abrupt change in input signal.

The fourth technology according to the present invention employs the bipolar transistors as the constituents, which enables the further acceleration because of their higher drivabilities.

The fifth technology according to the present invention employs the MOS transistors, which enables a high input impedance and a further saving in power dissipation in general compared with the bipolar transistor, for instance, saving battery expense during maneuvers for reduction in arms budget.

Incidentally, although it is difficult to fabricate resistors in MOS IC manufacturing steps for realizing the thirteenth and fourteenth technologies according to the present invention, the resistors can be easily connected to IC sockets externally, instead of interconnection on the surfaces of IC chips within IC packagings.

What is claimed is:

1. An operational amplifier comprising:
   first and second differential amplifying means for outputting a differential signal between a plurality of signals inputted from an input stage;
   an output means including a first and a second transistors, wherein signals outputted from said first differential amplifying means are inputted to said first transistor, which output signals in response to inputted signal level; and
   said second transistor controls variably bias electric currents flowing in said output means by using output signals from said second differential amplifying means.

2. The operational amplifier according to claim 1, wherein:
   said first and second differential amplifying means is a differential amplifier.

3. The operational amplifier according to claim 2, wherein:
   said differential amplifier acting as said first and second differential amplifying means is provided with means for reducing a conductance gm.

4. The operational amplifier according to claim 1, wherein:
   an output signal produced from said first differential amplifying means drives said output stage as a single ended output signal;
   said second differential amplifying means is formed of two transistors constituting a differential circuit of which base electrodes are applied with respective input signals through said normal input signal terminal and said inverted input signal terminal;
   each of said two transistors bears each current mirror circuit as a load;
   one of said current mirror circuits drives one transistor on said output stage which is constituted as the complementary SEPP circuit through still another current mirror circuit.

5. The operational amplifier according to claim 4, wherein:
   emitter electrodes of said two transistors constituting the differential amplifying configuration are connected to each other by short-circuiting; and
   said emitter electrodes are further connected through a constant current circuit to a reference potential point.

6. The operational amplifier according to claim 1, wherein;
- an output signal produced from said first differential amplifying means drives said output stage as a single ended output signal;
- said second differential amplifying means is formed of two transistors constituting a differential circuit of which gate electrodes are applied with the respective input signals through the normal input signal terminal and the inverted input signal terminal;
- each of said two transistors bears each current mirror circuit as a load;
- one of said current mirror circuits drives one transistor of said output stage which is constituted as a complementary SEPP circuit; and
- another of aforesaid current mirror circuits drives another transistor of aforesaid output stage constituted as the complementary SEPP-type circuit through still another current mirror circuit.

7. The operational amplifier according to claim 6, wherein:
- source electrodes of said two transistors constituting the differential amplifying configuration are connected to each other by short-circuiting; and
- further connected through a constant current circuit to a reference potential point.

8. The operational amplifier according to claim 1, wherein, said output means includes a source follower or an emitter follower.

9. The operational amplifier according to claim 4, wherein:
- each emitter electrode of said two transistors constituting said differential amplifying configuration is connected through each resistor to a constant current source which is further connected to a reference potential point.

10. An operational amplifier provided with an input stage having differential amplifying means and an output stage producing a certain driving power by means of constant current supply means comprising:
- detecting means for detecting a differential voltage between a normal input signal terminal and an inverted inputted signal terminal of said input stage; and electric current varying means for varying a constant current supplied from said constant current supply means in response to an output signal produced from said detecting means wherein;
- an output signal produced from said differential amplifying means drives said output stage as a singled ended output signal;
- said detecting means is formed of two transistors constituting a differential circuit of which base electrodes are applied with respective input signals through said normal input signal terminal and said inverted input signal terminal;
- each of said two transistors bears each current mirror circuit as a load;
- one of said current mirror circuits drives one transistor on said output stage which is constituted as a complementary SEPP circuit;
- another of said current mirror circuits drives another transistor on said output stage constituted as the complementary SEPP circuit through still another current mirror circuit and wherein
- each emitter electrode of said two transistors constituting the differential amplifying configuration is connected through each constant current circuit to a reference potential point; and
- said emitter electrodes are further connected to each other through a resistor.

11. An operational amplifier comprising:
- first and second differential amplifying means for outputting a differential signal between a plurality of signals inputted from an input stage;
- a first and second output means respectively including a first and a second transistors, wherein signals outputted from said differential amplifying means are inputted to said first transistors, which output signals in response to inputted signal level; and
- said second transistors control variably bias electric current flowing in said outputting means by using output signals from said second differential amplifying means; and
- said bias electric current following in said first output means is controlled so as to increase when an output level from said first differential amplifying means increases and said bias electric current flowing in said second output means is controlled so as to increase when the output level from said first differential amplifying means decreases.

12. The operational amplifier according to claim 11, wherein, said first and second output means includes a source follower or an emitter follower.

* * * * *

UNITED STATES PATENT AND TRADEMARK OFFICE
CERTIFICATE OF CORRECTION

| | |
|---|---|
| PATENT NO. | : 6,215,357 B1 |
| APPLICATION NO. | : 09/141799 |
| DATED | : April 10, 2001 |
| INVENTOR(S) | : Katsuhito Sakurai |

It is certified that error appears in the above-identified patent and that said Letters Patent is hereby corrected as shown below:

IN THE SPECIFICATION:

In column 4, line 38, please insert -- 5 -- after terminal.

IN THE CLAIMS:

In column 10, claim 1, line 30, please insert -- an -- after to.

In column 11, claim 9, please delete claim 9 and insert therefor
-- 9. An operational amplifier provided with an input stage having differential amplifying means and an output stage producing a certain driving power by means of constant current supply means, comprising:
   detecting means for detecting a differential voltage between a normal input signal terminal and an inverted inputted signal terminal of said input stage; and
   electric current varying means for varying a constant current supplied form said constant current supply means in response to an output signal produced from said detecting means wherein:
an output signal produced from said differential amplifying means drives said output stage as a singled ended output signal;
   said detecting means is formed of two transistors constituting a differential circuit of which base electrodes are applied with respective input signals through said normal input signal terminal and said inverted input signal terminal;
   each of said two transistors bears each current mirror circuit as a load;
   one of said current mirror circuits drives one transistor on said output stage which is constituted as a complementary SEPP circuit;
   another of said current mirror circuits drives another transistor on said output stage constituted as the complementary SEPP circuit through still another current mirror circuit and

UNITED STATES PATENT AND TRADEMARK OFFICE
CERTIFICATE OF CORRECTION

PATENT NO. : 6,215,357 B1
APPLICATION NO. : 09/141799
DATED : April 10, 2001
INVENTOR(S) : Katsuhito Sakurai It is certified that error appears in the above-identified patent and that said Letters Patent is hereby corrected as shown below:

each emitter electrode of said two transistor constituting said differential amplifying configuration is connected through each resistor to a constant current source which is further connected to a reference potential point. --

Signed and Sealed this

Eighth Day of April, 2008

JON W. DUDAS
*Director of the United States Patent and Trademark Office*